(12) United States Patent
Ong et al.

(10) Patent No.: US 8,818,072 B2
(45) Date of Patent: Aug. 26, 2014

(54) RENDERED DATABASE IMAGE-TO-INSPECTION IMAGE OPTIMIZATION FOR INSPECTION

(75) Inventors: Biow-Hiem Ong, Singapore (SG); Rick Lai, Taichung (TW); Chih-Chiang Tu, Tauyen (TW); Chia-Shih Lin, Hsinchu (TW); Jong-Yuh Chang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 550 days.

(21) Appl. No.: 12/868,483

(22) Filed: Aug. 25, 2010

(65) Prior Publication Data
US 2012/0051621 A1 Mar. 1, 2012

(51) Int. Cl.
*G06K 9/00* (2006.01)

(52) U.S. Cl.
USPC ........................................................ 382/144

(58) Field of Classification Search
None
See application file for complete search history.

(56) References Cited

U.S. PATENT DOCUMENTS 6,828,542 B2 * 12/2004 Ye et al. ..................... 250/208.1
2006/0273266 A1 * 12/2006 Preil et al. ..................... 250/548

* cited by examiner

*Primary Examiner* — Paul Danneman
(74) *Attorney, Agent, or Firm* — Haynes and Boone, LLP

(57) ABSTRACT

The present disclosure provides a method of inspecting a photolithographic mask wherein a design database is received, and a feature of the design database is adjusted by a bias factor to produce a biased database. Image rendering is performed on the biased database to produce a biased image. A mask is also created using the design database, and the mask is imaged to produce a mask image. The biased image is compared to the mask image, and a new value for the bias factor may be determined based on the comparison.

18 Claims, 7 Drawing Sheets

RENDERED DATABASE IMAGE-TO-INSPECTION IMAGE OPTIMIZATION FOR INSPECTION

BACKGROUND

Photolithography is a process for creating changes in a light-sensitive medium. In order to selectively expose portions of a light-sensitive medium using direct photolithography, a light-blocking medium, or mask, is placed between a light source and the light-sensitive medium. Alternately, a reflective mask may be used to reflect light on to the light-sensitive medium. When the features are large, the exposed shapes of the light-sensitive medium closely correspond to the shapes of the features of the mask. However, as feature size shrinks, behaviors of light such as diffraction, fringing and interference become more significant. Reducing the wavelength of the light source reduces these effects. In the production of semiconductors, photolithography is performed using ultraviolet light sources and other radiation beams such as ion beams, x-ray, extreme ultraviolet (EUV), and deep ultraviolet (DUV). When high-frequency light is not sufficient, a mask may require alterations such as serifs or hammerheads to expose a desired design feature. A mask may also require subresolution assist features, features that are not large enough to resolve directly on the light-sensitive medium but that are large enough to affect the behavior of light passing through other features. These alterations are termed optical proximity correction (OPC) features.

The same light behaviors that necessitate OPC features prevent mask features from being inspected directly. Instead, a simulation model is used to predict how a mask based on the design specification will appear upon inspection. This model can then be compared to an image of the mask. However, comparisons based on these models report a significant number of differences that do not correspond to actual mask errors. Frequently, these differences must be manually evaluated to determine whether mask corrections are required. Evaluation is expensive, laborious and time-consuming. Methods of increasing the accuracy of the models and reducing the number of false errors present a real value.

BRIEF DESCRIPTION OF THE DRAWINGS

The present disclosure is best understood from the following detailed description when read with the accompanying figures. It is emphasized that, in accordance with the standard practice in the industry, various features are not drawn to scale. The dimensions of the various features may be arbitrarily increased or reduced for clarity of discussion.

DETAILED DESCRIPTION

Figure 1:
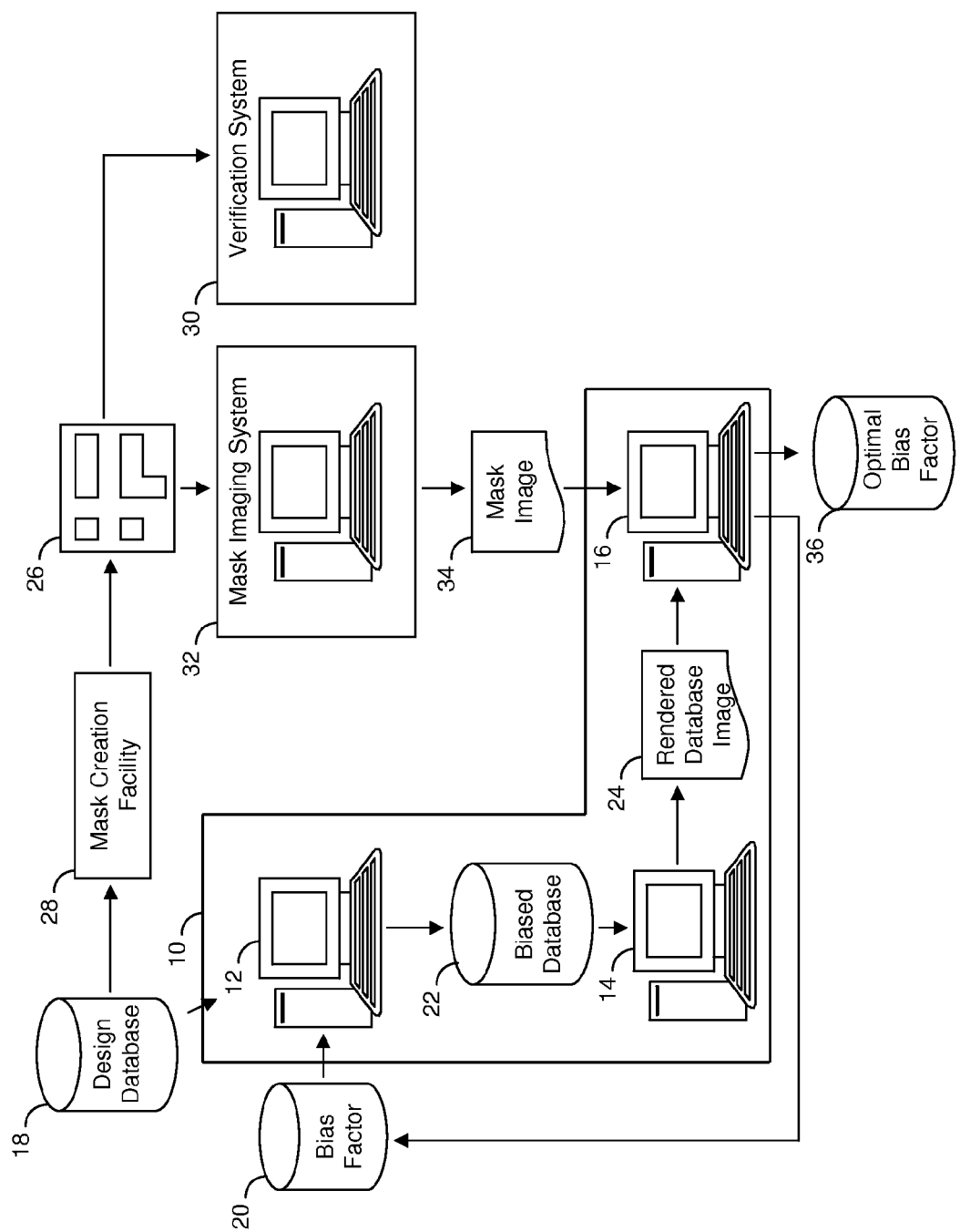
FIG. 1 is a diagram of a system for performing inspection of a photolithographic mask in accordance with one embodiment of the present disclosure.

The present disclosure relates to inspection of photolithographic masks. While the present disclosure is described in terms of creating integrated circuits, it will be appreciated that the production of any device that is manufactured utilizing photolithographic masks can benefit from the present invention.

It is understood that the following disclosure provides many different embodiments or examples for implementing different features of the invention. Specific examples of components and arrangements are described below to simplify the present disclosure. These are merely examples and are not intended to be limiting. Some items are shown in a simplified form and inherently include components that are well known in the art. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, an embodiment of a system 10 for inspection of a photolithographic mask contains a biasing system 12, a rendering system 14, and a comparison system 16. Systems 12, 14 and 16 each contain one or more computing devices. Alternately, one or more of systems 12, 14 and 16 may be contained within a single computing device. For example, the computing device may include a server, a supercomputer, a personal computer, a personal digital assistant, pager, cellular telephone, other suitable computing device and/or combinations thereof. The computing device may include components such as a central processing unit (CPU), a memory unit, an input/output (I/O) device, and/or a network interface. Such components may be interconnected by a bus system. It is understood that each computer system may be differently configured and that each of the listed components represent several different component. For example, the CPU may include a multi-processor or a distributed processing system; the memory unit may include different levels of cache memory, main memory, hard disks, and/or remote storage locations; the I/O device may include monitors, mice, and/or keyboards; and the network interface may be a modem, a wireless transceiver, and/or one or more network interface cards. Because the computing devices may be connected to the network, certain components may, at times, be shared with other devices. Therefore, a wide range of flexibility is anticipated in the configuration of the computing devices.

Referring still to FIG. 1, a design database 18 is input into system 10. The design database 18 is identified by one or more data files containing all or a subset of geometric patterns which correspond to features of a mask. These geometric patterns are commonly stored in a layout description language such as GDS-II or Oasis. Because the design database 18 contains the geometric patterns as they are intended to appear on a mask, the design database 18 can be considered a golden model when inspecting an associated mask. However, when the feature size is small, properties of light such as diffraction, fringing and interference will have pronounced effects on light passing through or reflecting off of mask features. For example, a square aperture in a mask may project a circle of light on the detector. The result is that even for a perfect mask, the features reported by an imaging tool will not match the patterns in the design database 18.

In one embodiment, an initial bias factor 20 is determined and the biasing system 12 adjusts one or more features of the design database 18 in accordance with the bias factor 20. This may involve altering the features' size, location, or overall shape. The bias factor 20 may include a global bias wherein all features are altered by a particular bias factor. It may include a regional bias wherein all features in a region are adjusted by a particular bias factor. It may include a feature bias wherein categories of features (e.g., serifs, hammerheads and/or corners) are adjusted by a particular bias factor. It may also include a specific bias wherein a single specific feature is adjusted by a particular bias factor. One skilled in the art would recognize that bias values are not required to be equivalent across types nor are they required to be equivalent along both axes. The biasing system 12 outputs a biased database 22 based on the adjusted features of the design database 18. The biased database 22 may contain geometric patterns corresponding to all or a subset of the geometric patterns contained within the design database 18. In some embodiments, the biased database 22 will not be in the same format as the design database 18.

The rendering system 14 reads in a database and simulates mask creation by determining how a corresponding mask would appear when viewed by a mask imaging tool. The biased database 22 is input into the rendering system 14. The rendering system outputs a Rendered Database Image 24 (also referred to as Reference Image) which represents an image of an ideal mask created using the biased database 22.

A mask 26 is created by a mask creation facility 28. Whereas the rendering system 14 creates a simulated mask based on the biased database 22, the mask creation facility 28 creates the actual mask 26 using the design database 18. The mask 26 may include a substrate, an absorption layer, and/or one or more attenuating layers. The substrate may include fused silica, fused quartz, calcium fluoride, and/or other suitable material. The absorption layer may include chromium (CR), MoSi, and/or other suitable materials. Typically, the mask pattern corresponding to the design database 18 is etched into the absorption layer. This may be done using a mask writing technique such as electron beam writing, ion beam writing, etching such as wet or dry etching, or using an alternative mask writing technique. Attenuating layers may be formed that include such materials as metal silicide, metal nitride, iron oxide, inorganic material and/or other suitable materials. The mask 26 may further include one or more reflective layers. These reflective layers may be created using materials such as silicon/molybdenum, molybdenum/beryllium, and/or other suitable materials.

The mask 26 is verified, in whole or in part, by a verification system 30. Verification refers to determining whether the mask 26 prints correctly. Verification may be performed by one or more of a variety of techniques including direct inspection, measuring the transmission or reflection of an electron beam, test printing on a light-sensitive medium, or other verification technique. The verification system may include an electronic microscope (including a radiation source such as a light source or an electron gun, an imaging sensor, and a computing device to record data from the imaging sensor); a wafer test system (including a wafer prober and a computing device to control the test and record data); a chip test system (including a chip tester and a computing device to control the test and record data); and/or other systems for verifying a mask or a semiconductor device. Errors in the mask 26, defined as regions that do not print as intended, need not be corrected provided they are identified.

The mask 26 is imaged by a mask imaging system 32. The mask imaging system 32 captures an image of the mask 26. The mask imaging system 32 may include a light source, an imaging sensor, and computing hardware to record the output of the imaging sensor. The mask imaging system 32 may be configured to measure light reflected from or transmitted through the mask 26. The light source may operate at an actinic frequency, a frequency used to expose a wafer, but commonly, imaging is performed with a light source with a lower frequency. The mask imaging system 32 records the raw values measured from the imaging sensor, and it may also perform post processing to increase clarity, resolution, to simulate inspection in an alternate optical plane, or to highlight relevant features. The processed or unprocessed measurements are output as a mask image 34.

A portion of the mask image 34 corresponding to a verified portion of the mask 26 is compared to the Rendered Database Image 24 by the comparison system 16. The comparison system 16 may compare the entire design or a subset thereof. A reported difference between the mask image 34 and the Rendered Database Image 24 that is not associated with a material error in the mask 26 is a false-positive. False-positives require time to evaluate. Because an unbiased database such as the design database 18 may produce thousands of false-positives in a relatively small region, reducing false-positives via proper biasing can greatly decrease the time required to evaluate a mask. Comparison may also result in a false-negative, wherein a material error in the mask 26 is not associated with a reported difference. False-negatives may not be caught until after the cost of correcting the error has gone up, or they may not be caught at all. If an error is not found before a flawed mask is used in production, the mask has the potential to create a significant amount of damaged products. One method of reducing this risk is to add a guard band to the design rules. Increasing the accuracy of mask inspection reduces false-negatives, reduces the risk of a flawed mask being used in production, and reduces the need for guard banding in the design rules.

A properly-biased Rendered Database Image 24 will produce a minimal number of false-positives and false-negatives. If the number of either false-positives or false-negatives is unacceptable, a new bias factor 20 will be determined, and the design database 18 will be adjusted again by the biasing system 12. If the number of false-positives and false-negatives is acceptable, the bias factor 20 is an optimal bias factor 36.

Figure 2:
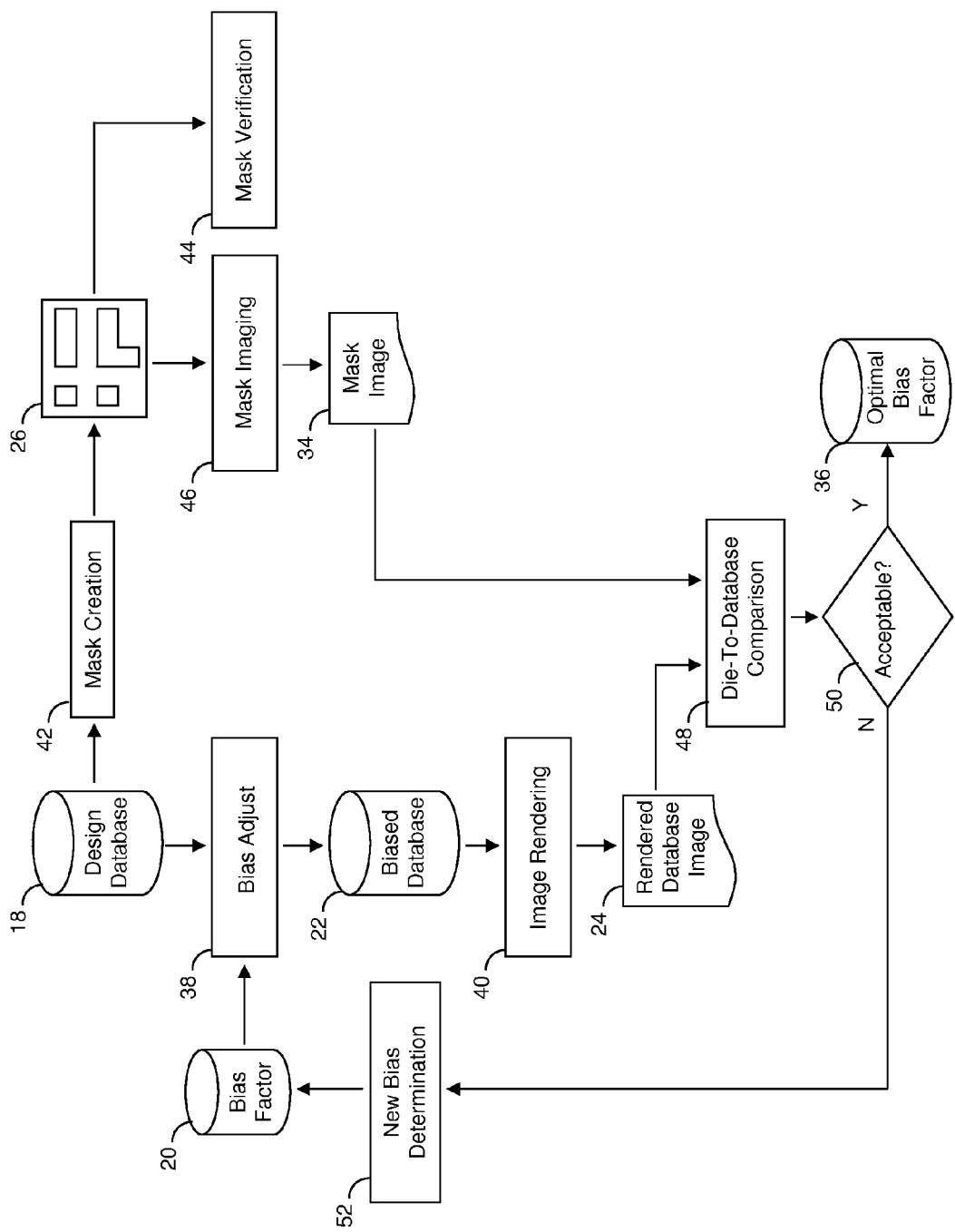
FIG. 2 is a flow diagram of a method for implementing a photolithographic mask inspection process in accordance with one embodiment of the present disclosure.

Referring to FIG. 2, a method for inspecting a photolithographic mask begins by receiving the design database 18 and the bias factor 20. A bias adjust 38 is performed on the design database 18 to modify the features of the design database 18 by the bias factor 20. The resulting shapes are output as the biased database 22. Image rendering 40 is performed on the biased database 22. Image rendering 40 simulates the creation of a mask corresponding to the shapes contained in the biased database 22 and calculates the appearance as if the mask were viewed by a mask imaging tool. The simulated result is output as the Rendered Database Image 24.

The design database 18 is also used as an input in creating the mask 26 by mask creation 42. The mask 26 is verified by mask verification 44 to determine whether the mask 26 creates the intended shapes on an exposed wafer. Mask imaging 46 is performed on the mask 26 to capture the mask image 34.

A die-to-database comparison 48 is made between the Rendered Database Image 24 and the mask image 34. As indicated by decision block 50, a determination is made as to whether the number of false-positives and false-negatives are acceptable. If the numbers are not acceptable, a new bias determination 52 is performed to generate a new value for the bias factor 20. Then, the bias adjust 38 is performed again on the design database 18 with a new value for bias factor 20. If the number of false-positives and false-negatives are acceptable, the bias factor 20 is the optimal bias factor 36.

Figure 3:
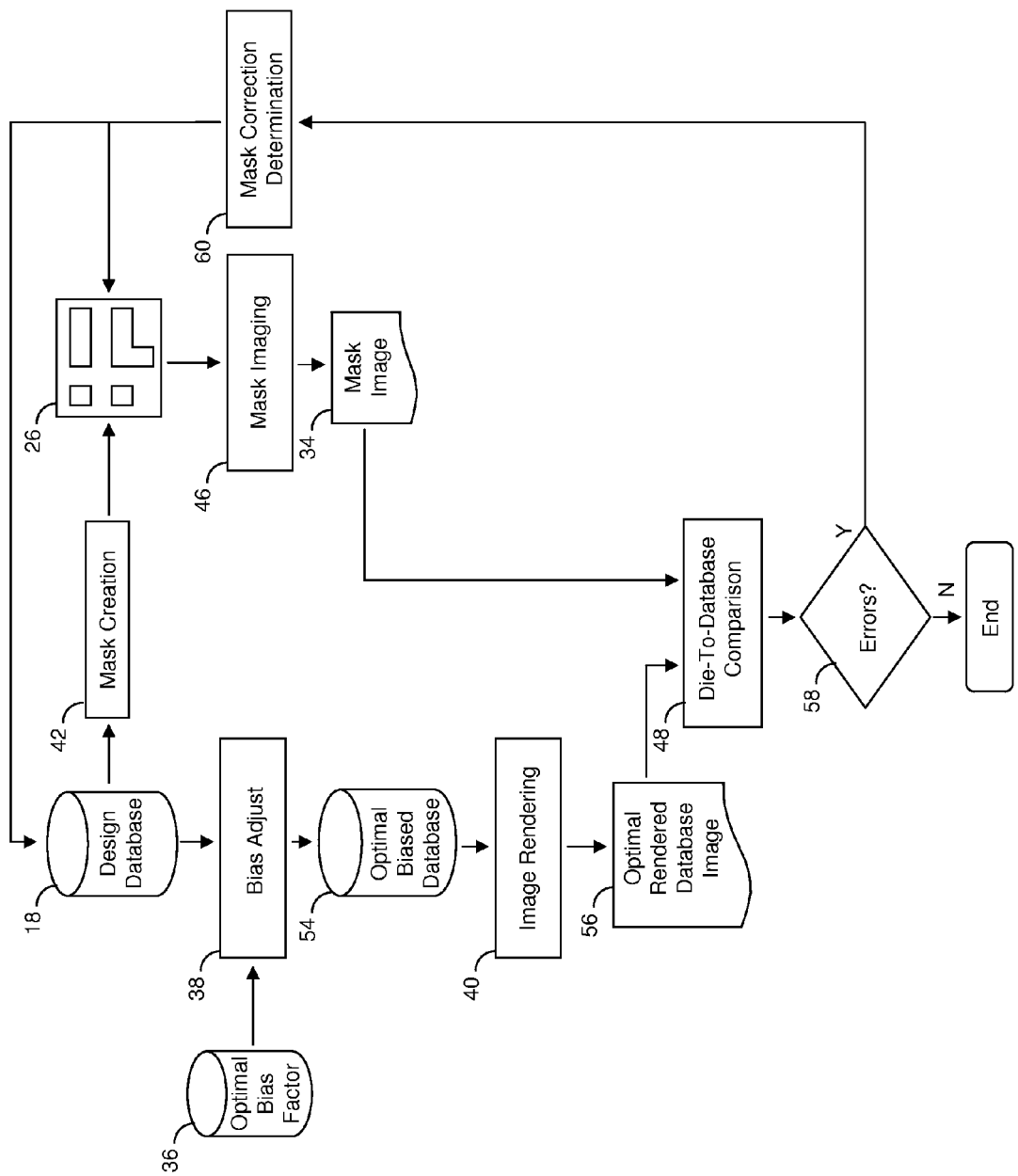
FIG. 3 is a flow diagram of a method for implementing a photolithographic mask inspection process and correction process in accordance with one embodiment of the present disclosure.

Referring to FIG. 3, in accordance with a further embodiment, the optimal bias factor 36 may be used to check and correct errors in the mask 26 prior to its use in production. The method begins by performing the bias adjust 38 on the design database 18 using the optimal bias factor 36. The bias adjust 38 produces an optimal biased database 54. Image rendering 40 is performed on the optimal biased database 54 to produce an optimal Rendered Database Image 56. Meanwhile, mask creation 42 manufactures the mask 26 corresponding to the design database 18. Mask imaging 46 is performed on the mask 26 and creates the mask image 34. The mask image 34 is compared to the optimal Rendered Database Image 56 by the die-to-database comparison process 48. Next, it must be determined whether the differences correspond to material errors in the mask 26 in decision block 58. For material errors, mask correction determination 60 is performed to establish the optimal solution to correct the error. Corrections may be implemented via changes to the mask 26, the design database 18, and/or any other suitable process or element. Because adjusting the design database 18 by the optimal bias factor 36 results in fewer false conditions during die-to-database comparison 48, biasing reduces the amount of time required to evaluate reported differences in order to determine which differences require mask corrections.

Figure 4:
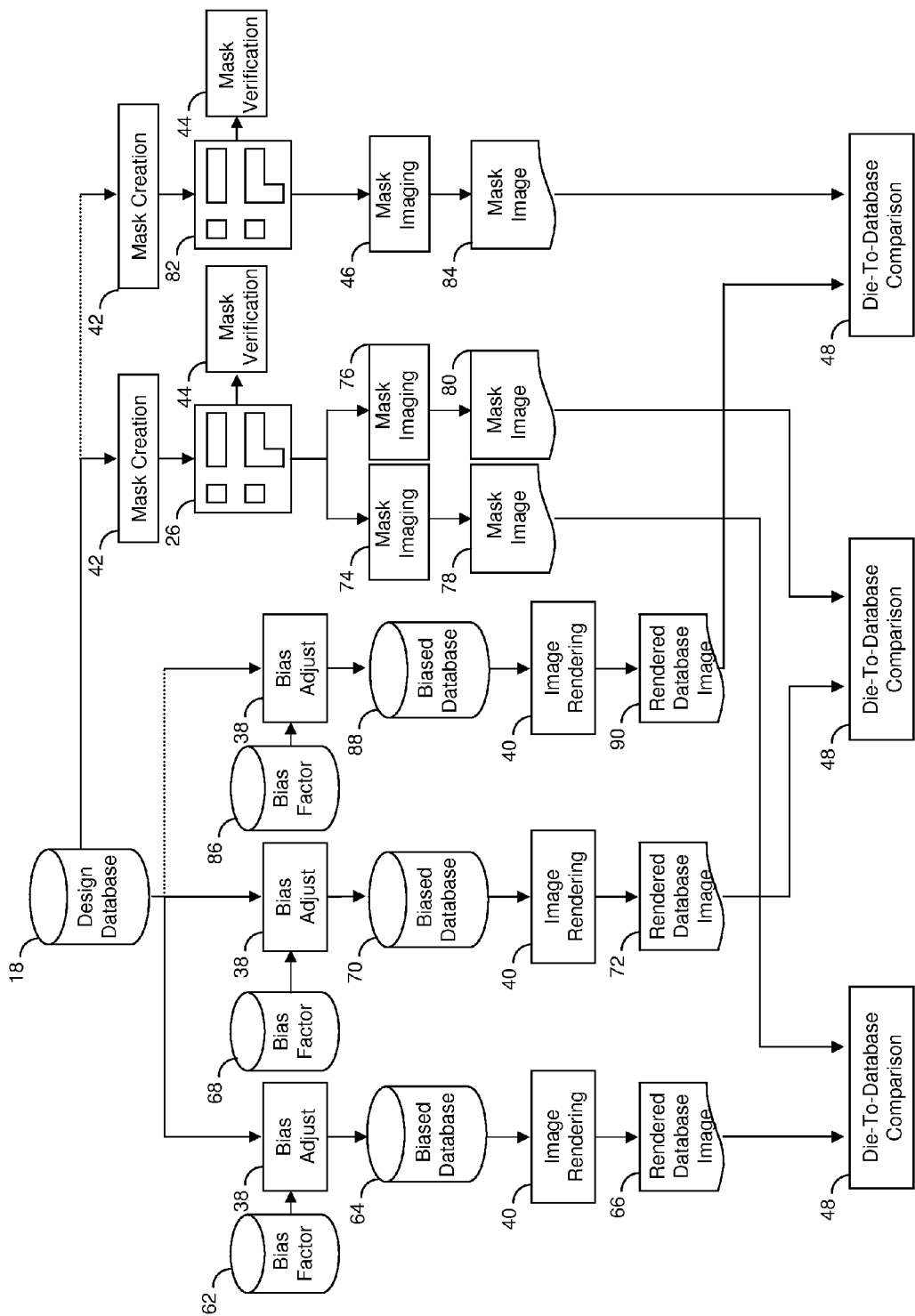
FIG. 4 is a flow diagram of a method for implementing a photolithographic mask inspection process utilizing multiple bias factors in accordance with one embodiment of the present disclosure.

Referring to FIG. 4, in another embodiment, the number of false errors is further reduced by adjusting the design database 18 by two or more independent bias factors each optimized for a particular process variable. For example, inspection of a mask measuring the light transmitted through the mask will report different edge locations than inspection of the mask measuring the light reflected by it. Therefore, it may be beneficial to determine a bias factor for transmitted light independently of a bias factor for reflected light. As another example, a mask may be inspected in the wafer plane as well as in the aerial plane. Inspection in alternate optical planes may report different edge locations justifying a bias factor for each inspection plane.

To accomplish this, the design database 18 is adjusted by a bias factor 62 to create a biased database 64. Image rendering 40 is performed on the biased database 64 to create a Rendered Database Image 66. Likewise, the design database 18 is adjusted by a bias factor 68 to create a biased database 70. Image rendering 40 is performed on the biased database 70 to create a Rendered Database Image 72. The design database 18 is also used to create the mask 26. Mask inspection 74 and mask inspection 76 represent inspection in the two different inspection modes. Mask inspection 74 of the mask 26 produces mask image 78. Mask inspection 76 of the mask 26 produces mask image 80. Die-to-database comparison 48 is performed to compare the mask image 78 with the Rendered Database Image 66, and die-to-database comparison 48 is performed to compare the mask image 80 with the Rendered Database Image 72. Performing two different die-to-database comparisons allows the bias factor 62 and bias factor 68 to be tuned independently, reducing the number of false conditions that must be manually reviewed.

Referring still to FIG. 4, in another embodiment, two or more bias factors corresponding to two or more mask materials are independently optimized. Mask materials may have different light coefficients (n/k), and they may produce different edge locations during mask imaging 46. Therefore, when the design database 18 is implemented in more than one mask manufactured from more than one mask material, the number of false errors can further be reduced by optimizing an independent bias factor for each mask material.

In accordance with the present embodiment, the mask 26 is created from design database 18. Additionally, a mask 82 is also created from design database 18. The mask 82 may be manufactured using a different mask material from that used to manufacture mask 26. Mask imaging 46 is performed on mask 82 and produces a corresponding mask image 84. Meanwhile, the design database 18 is adjusted by bias factor 86, which corresponds to the mask material used to create mask 82. The bias adjust 38, using bias factor 86, produces a biased database 88. Image rendering 40 is performed on the biased database 88 to calculate a Rendered Database Image 90. A die-to-database comparison 48 is performed to compare mask image 84 with Rendered Database Image 90. One skilled in the art will recognize that a bias factor may be optimized for several test parameters (such as reflected, wafer plane inspection of type X blanks) and still be within the spirit and scope of this disclosure.

Figure 5:
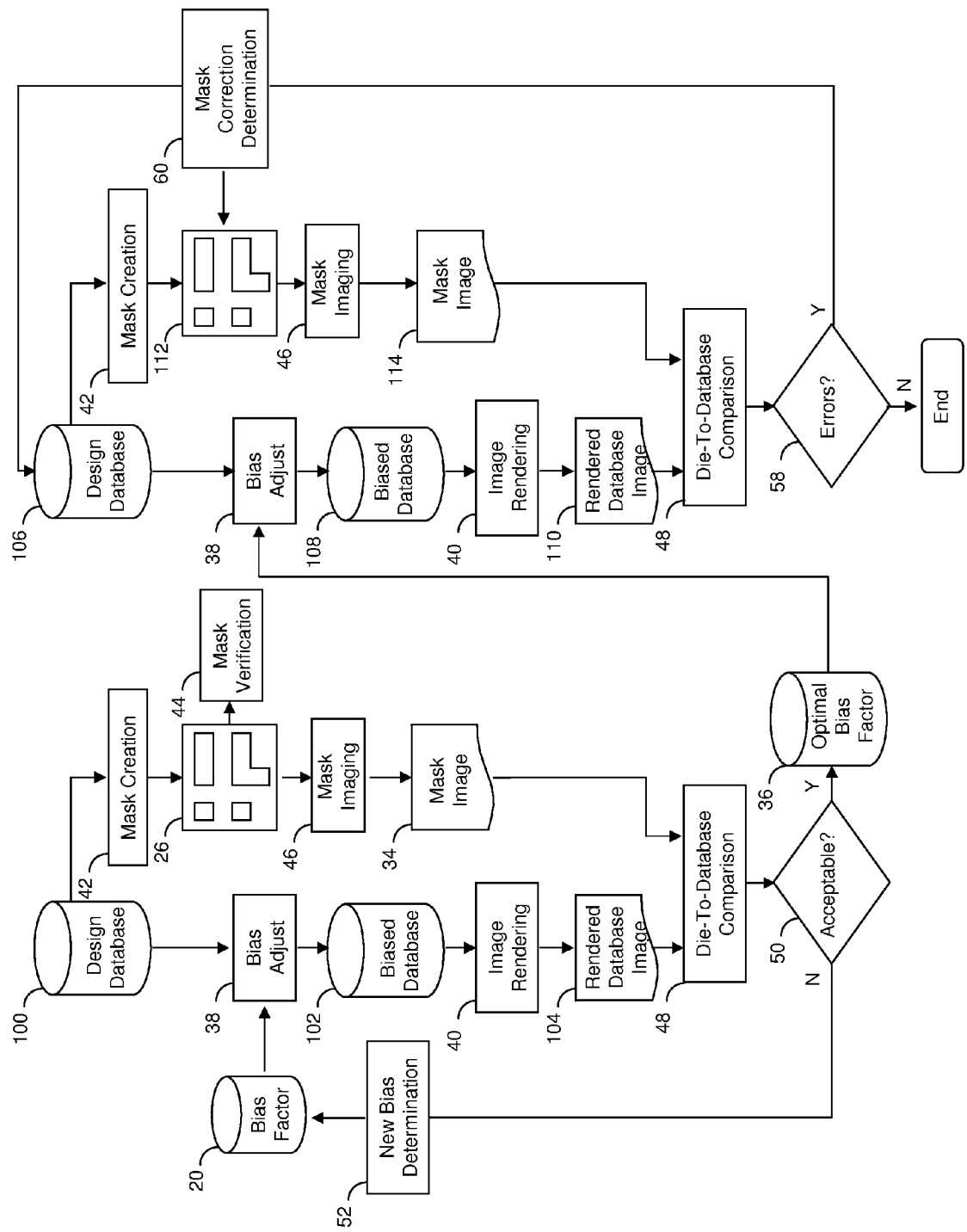
FIG. 5 is a flow diagram of a method for implementing a photolithographic mask inspection process utilizing multiple design databases in accordance with one embodiment of the present disclosure.

Referring to FIG. 5, a flow diagram of another embodiment, it is possible to use different design databases for tuning the bias factor 20 and for creating a production mask. The design database used for tuning can then be designed to contain structures that are simple to test or that are high-risk. This will prove especially useful if these structures occur infrequently in a production design. The design database used for tuning may also be smaller than the design database for creating a production mask. Because the process of verifying a mask can be expensive and time-consuming, a smaller database allows more cost-effective and efficient tuning.

Referring still to FIG. 5, a design database 100 is adjusted by the bias factor 20 to produce a biased database 102. Image rendering 40 is performed on the biased database 102 to produce a Rendered Database Image 104. The mask 26 is created from the design database 100. Mask verification 44 is performed on the mask 26, as well as mask imaging 46 which produces mask image 34. Die-to-database comparison 48 determines differences between the mask image 34 and the Rendered Database Image 104. If the number of false errors reported by the die-to-database comparison is unacceptably high, a new bias determination 52 is performed to determine a new value for the bias factor 20. When the die-to-database comparison 48 results in an acceptable number of false-positives and false-negatives, the bias factor 20 is the optimal bias factor 36. A design database 106 is adjusted by the optimal bias factor 36 to create a biased database 108. Image rendering 40 of the biased database 108 results in a Rendered Database Image 110. Meanwhile, a mask 112 is created using the design database 106 and inspected to produce a mask image 114. A die-to-database comparison 48 is performed to compare the mask image 114 with the Rendered Database Image 110. Differences that correspond to errors in the mask 112 may be corrected by modifying the design database 106, the mask 112, and/or any other suitable process or element.

Embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Figure 6:
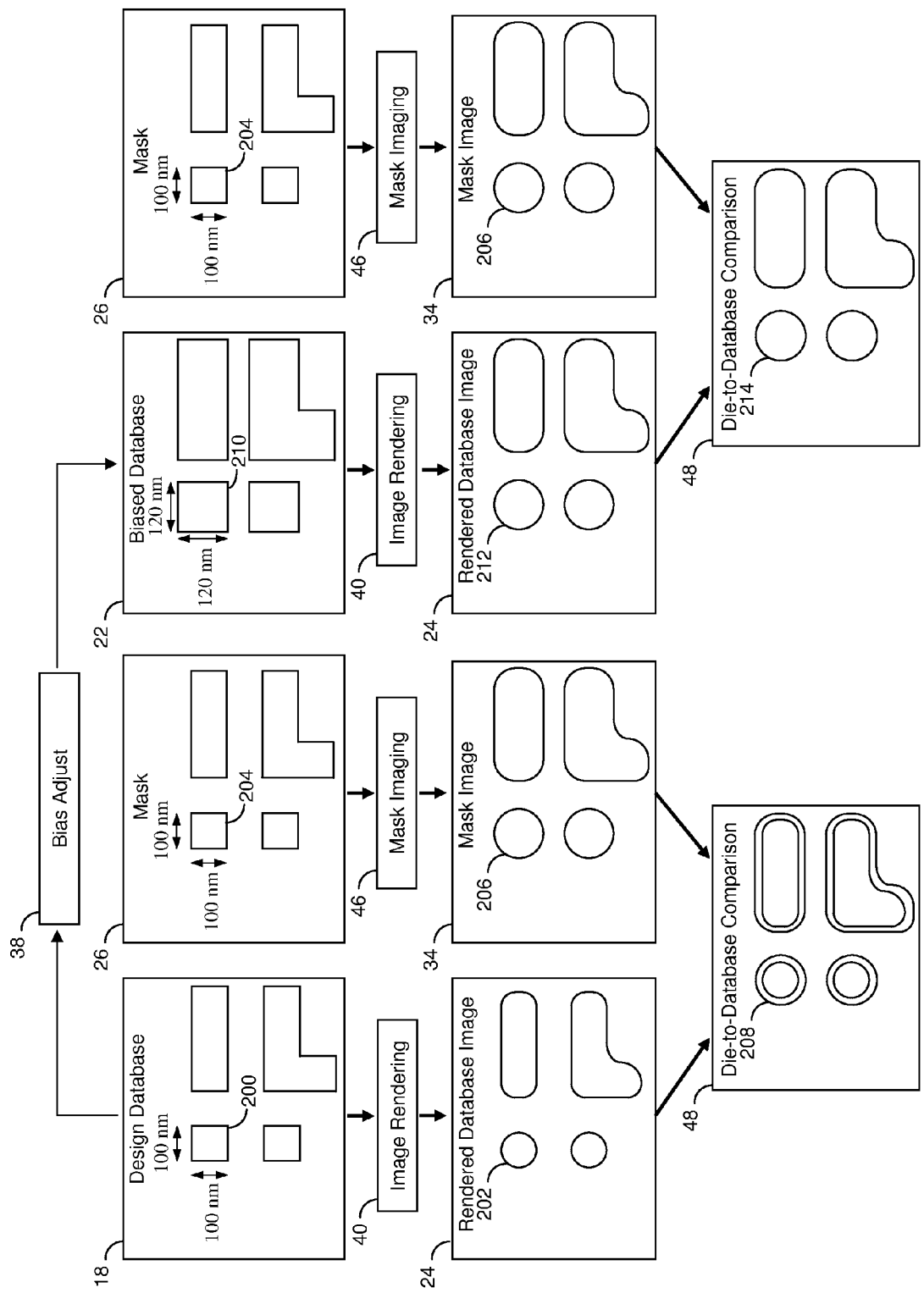
FIG. 6 is a simplified example of a design database biased to better correspond with an associated mask.

Referring to FIG. 6, a simplified example, in the design database 18, feature 200 is a square, 100 nm on a side. As can be seen, if image rendering 40 were to be performed on the design database 18, a corresponding feature 202 may be roughly circular. The image rendering 40 may affect the outcome of the Rendered Database Image 24. The mask 26 contains a feature 204 which has the same shape and location as feature 200. However, in this example, mask imaging 46 of the mask 26 produces a corresponding feature 206 which is larger than feature 204. Die-to-database comparison 48 reports an error, as illustrated by feature 208. To correct this, the bias adjust 38 is performed on the design database 18 to create the biased database 22. In the biased database 22, feature 210 is 120 nm on a side. Image rendering 40 of biased database 22 creates a Rendered Database Image 24 with feature 212. Feature 212 corresponds much closer in size to feature 206. Die-to-database comparison 48 reports no error, as illustrated by feature 214.

Figure 7:
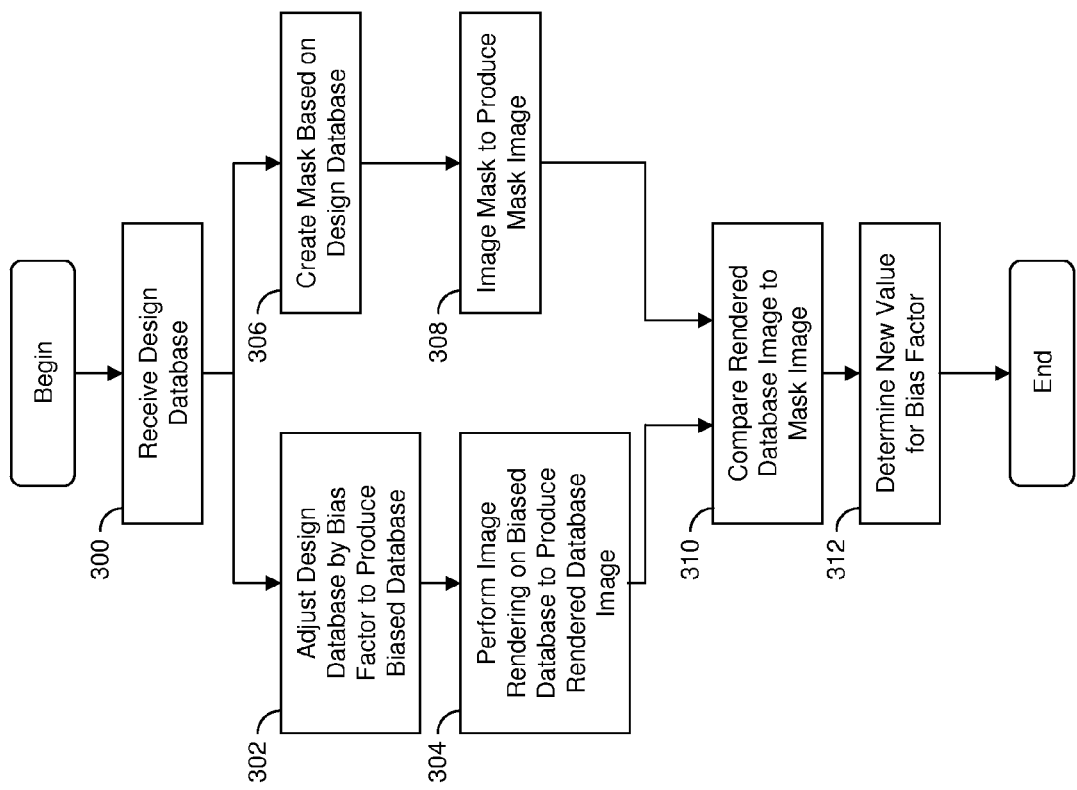
FIG. 7 is a flow diagram of a method for implementing a photolithographic mask inspection process in accordance with one embodiment of the present disclosure.

Referring to FIG. 7, in one embodiment, a method begins by receiving the design database 18 in block 300. The design database 18 is adjusted by the bias factor 20 to produce a biased database 22 in block 302. An image rendering 40 is performed on the biased database 22 to produce the Rendered Database Image 24 in block 304. The design database 18 is also used to create the mask 26 in block 306. The mask 26 is imaged to produce the mask image 34 in block 308. The Rendered Database Image 24 is compared to the mask image 34 in block 310. A new value for the bias factor 20 is determined in block 312.

Thus, the present disclosure provides a method of inspecting a photolithographic mask. In one embodiment, the method includes receiving a first design database and adjusting a feature of the first design database by a bias factor to produce a first biased database. The method may also include performing image rendering on the first biased database to produce a first rendered database image (also referred to as a first biased image or a first reference image). The method may further include receiving a first mask image, comparing the first rendered database image to the first mask image, and determining a new value for the bias factor based on the comparison. In a further embodiment, receiving the first mask image includes creating a first mask using the first design database and imaging the first mask to produce the first mask image.

In some embodiments, the method also includes determining an optimal bias factor based on the bias factor and adjusting a feature of the design database by the optimal bias factor to produce a second biased database. The method may also include performing image rendering on the second biased database to produce a second rendered database image (also referred to as a second biased image or a second reference image). The method may also include comparing the first rendered database image to the first mask image and correcting defects identified by comparing the second rendered database image to the first mask image. In further embodiments, the method may include creating a second mask, imagining the second mask to produce a second mask image, comparing the second rendered database image to the second mask image, and correcting defects identified by comparing the second rendered database image to the second mask image.

In some embodiments, the method includes receiving a first design database, adjusting a feature of the first design database by a first bias factor to produce a first biased database, and adjusting a feature of the first design database by a second bias factor to produce a second biased database. The first bias factor and second bias factor may relate to process variables such as a property of the first mask or a mode of inspection used to image the first mask.

The present disclosure also provides a system for inspecting a photolithographic mask including a biasing system capable of receiving a design database and a bias factor and designed to adjust a feature of the design database by the bias factor to produce a biased database; a rendering system capable of receiving a biased database and designed to simulate an image of a mask corresponding to the biased database and create a rendered database image; and a comparison system capable of receiving a mask image and a rendered database image and designed to compare the mask image to the rendered database image.

The present disclosure also provides an apparatus comprising a non-transitory, tangible computer readable storage medium storing a computer program, wherein the computer program has instructions that when executed carry out: adjusting a feature of a design database by a bias factor producing a biased database.

Features of several embodiments have been outlined above. Those skilled in the art will appreciate that they may readily use the present disclosure as a basis for designing or modifying other processes and structures for carrying out the same purposes and/or achieving the same advantages as the embodiments introduced above. Those skilled in the art will also realize that such equivalent constructions do not depart from the spirit and scope of the present disclosure, and that they may make various changes, substitutions and alterations to the disclosed embodiments without departing from the spirit and scope of the present disclosure.

What is claimed is:

1. A method of inspecting a photolithographic mask, comprising:
    receiving a first design database;
    receiving a bias factor specifying an adjustment to a feature of the first design database;
    adjusting, by a computing device, the feature of the first design database according to the bias factor to produce a first biased design database;
    performing, by an image rendering system, image rendering on the first biased design database to produce a first database image;
    receiving a first mask image of a physical mask created based on the first design database;
    comparing the first database image with the first mask image; and
    determining a new value for the bias factor based on the comparison.

2. The method of claim 1, wherein receiving the first mask image includes:
    creating the physical mask using the first design database; and
    imaging the physical mask to produce the first mask image.

3. The method of claim 1, wherein the bias factor relates to a property selected from a group consisting of:
    a material used in mask creation,
    a mode of light used in mask imaging, and
    an inspection plane used in mask imaging.

4. The method of claim 1, further comprising:
    determining an optimal bias factor based on the bias factor;

adjusting a feature of the first design database by the optimal bias factor to produce a second biased database;
performing image rendering on the second biased database to produce a second rendered database image;
comparing the second rendered database image with the first mask image; and
correcting defects identified by comparing the second rendered database image with the first mask image.

5. The method of claim 1, further comprising:
determining an optimal bias factor based on the bias factor;
receiving a second design database;
adjusting a feature of the second design database by the optimal bias factor to produce a second biased database;
performing image rendering on the second biased database to produce a second rendered database image;
receiving a second mask image;
comparing the second rendered database image to the second mask image; and
correcting defects identified by comparing the second rendered database image with the second mask image.

6. The method of claim 5, wherein receiving the second mask image includes:
creating a second mask using the second design database; and
imaging the second mask to produce the second mask image.

7. The method of claim 1, wherein the first mask image relates to a first mask material, the method further comprising:
receiving a second mask image relating to a second mask material;
adjusting a feature of the first design database by a second bias factor to produce a second biased database;
performing image rendering on the second biased database to produce a second rendered database image;
comparing the second rendered database image with the second mask image; and
determining a new value for the second bias factor based on the comparison of the second rendered database image with the second mask image.

8. The method of claim 7, wherein receiving the second mask image includes:
creating a second mask having the second mask material and using the first design database; and
imaging the second mask to produce the second mask image.

9. The method of claim 1, wherein the first mask image relates to imaging in a first mode, the method further comprising:
receiving a second mask image relating to imaging in a second mode;
adjusting a feature of the first design database by a second bias factor to produce a second biased database;
performing image rendering on the second biased database to produce a second rendered database image;
comparing the second rendered database image with the second mask image; and
determining a new value for the second bias factor based on the comparison of the second rendered database image with the second mask image.

10. The method of claim 9, wherein:
receiving the second mask image includes:
creating a first mask using the first design database; and
imaging the first mask in the second mode to produce the second mask image; and wherein the first mode and the second mode relate to a property selected from a group consisting of: a mode of light used in mask imaging and an inspection plane used in mask imaging.

11. The method of claim 1, wherein a result of the comparing indicates a degree of matching between the first database image and the first mask image, and further comprising: improving the matching between the first database image and the first mask image by using different simulation models.

12. A system for inspecting a photolithographic mask, the system comprising a computing device, the computing device including:
a first interface operable to receive a design;
a second interface operable to receive a bias factor specifying an adjustment to a feature of the received design;
a biasing module operable to adjust the feature of the design based on the bias factor and thereby to produce a biased design;
a rendering module operable to produce a biased design image from the biased design; and
a comparison module operable to compare the biased design image to a mask image of a physical mask created based on the unbiased design.

13. The system of claim 12, wherein the bias factor relates to a property selected from a group consisting of:
a material used in mask creation,
a mode of light used in mask imaging, and
an inspection plane used in mask imaging.

14. The system of claim 12, wherein the comparison module is further operable to determine an optimal bias factor determined to improve matching between the biased design image and the mask image.

15. The system of claim 12, further comprising:
a mask creation module capable of receiving the design and operable to create the physical mask; and
a mask imaging module capable of receiving the physical mask and operable to produce the mask image.

16. An apparatus comprising:
a first interface operable to receive a design database;
a second interface operable to receive a bias factor, the bias factor specifying an adjustment to a feature of the design database; and
a non-transitory, tangible computer readable storage medium storing a computer program;
wherein the computer program has instructions that, when executed, carry out:
adjusting the feature of the design database based on the bias factor to produce a biased database;
rendering the biased database; and
comparing the rendered biased database to a mask image of a physical mask created based on the design database.

17. The apparatus of claim 16, wherein the bias factor relates to a property selected from a group consisting of:
a material used in mask creation,
a mode of light used in mask imaging, and
an inspection plane used in mask imaging.

18. The apparatus of claim 16, wherein the computer program has an additional set of instructions that when executed, carry out:
determining a modified bias factor to improve matching between the rendered biased database and the mask image.

* * * * *